(12) United States Patent
Brick et al.

(10) Patent No.: US 11,177,416 B2
(45) Date of Patent: Nov. 16, 2021

(54) OPTOELECTRONIC COMPONENT, A MODULE HAVING AT LEAST TWO OPTOELECTRONIC COMPONENTS, AND A METHOD FOR PRODUCING AN OPTOELECTRONIC COMPONENT

(71) Applicant: OSRAM OLED GmbH, Regensburg (DE)

(72) Inventors: Peter Brick, Regensburg (DE); Ulrich Streppel, Regensburg (DE); Christopher Wiesmann, Barbing (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/466,641

(22) PCT Filed: Nov. 29, 2017

(86) PCT No.: PCT/EP2017/080799
§ 371 (c)(1),
(2) Date: Jun. 5, 2019

(87) PCT Pub. No.: WO2018/104125
PCT Pub. Date: Jun. 14, 2018

(65) Prior Publication Data
US 2019/0326482 A1    Oct. 24, 2019

(30) Foreign Application Priority Data
Dec. 5, 2016   (DE) .................... 10 2016 224 090.0

(51) Int. Cl.
*H01L 33/50* (2010.01)
*H01L 33/60* (2010.01)

(52) U.S. Cl.
CPC .......... *H01L 33/504* (2013.01); *H01L 33/507* (2013.01); *H01L 33/508* (2013.01); *H01L 33/60* (2013.01); *H01L 2933/0041* (2013.01)

(58) Field of Classification Search
CPC ....... H01L 33/60; H01L 33/58; H01L 33/504; H01L 2933/0041; H01L 33/54;
(Continued)

(56) References Cited

U.S. PATENT DOCUMENTS 7,284,871 B2 * 10/2007 Oon ................. H05B 45/00
362/17
9,210,763 B2 * 12/2015 Chen ................... H01L 33/504
(Continued)

FOREIGN PATENT DOCUMENTS

DE    102009037186 A1    2/2011
DE    102012102301 A1    9/2013
(Continued)

OTHER PUBLICATIONS

International Search Report based on Application No. PCT/EP2017/080799 (14 pages + 3 pages English Translation) dated Jan. 19, 2018 (for reference purpose only).
(Continued)

*Primary Examiner* — Khiem D Nguyen
(74) *Attorney, Agent, or Firm* — Viering, Jentschura & Partner Mbb

(57) ABSTRACT

An optoelectronic component may include at least one semiconductor chip for emitting electromagnetic radiation, a conversion element, and an optical element. The conversion element may at least partially convert primary radiation emitted by the semiconductor chip(s) into secondary radiation where the conversion element is arranged downstream of the semiconductor chip(s) in the emission direction and is arranged on the semiconductor chip(s). The optical element
(Continued)

may be arranged downstream of the conversion element in the emission direction and where the conversion element is subdivided into individual portions.

20 Claims, 6 Drawing Sheets

(58) Field of Classification Search
CPC ... H01L 33/502; H01L 33/505; H01L 33/508; H01L 33/507; H01L 33/50; H01L 33/52
See application file for complete search history.

(56) References Cited

U.S. PATENT DOCUMENTS

| | | | | |
|---|---|---|---|---|
| 9,337,447 | B2* | 5/2016 | Krummacher | H01L 51/5275 |
| 9,379,293 | B2* | 6/2016 | Schricker | H01L 33/0041 |
| 2008/0111141 | A1* | 5/2008 | Li | H01L 33/54 |
| | | | | 257/88 |
| 2011/0025190 | A1* | 2/2011 | Jagt | H01L 33/58 |
| | | | | 313/499 |
| 2011/0205740 | A1* | 8/2011 | Rindt | C03B 23/0013 |
| | | | | 362/293 |
| 2011/0297975 | A1* | 12/2011 | Yeh | H04N 9/315 |
| | | | | 257/88 |
| 2012/0007131 | A1 | 1/2012 | Ueno et al. | |
| 2012/0168786 | A1* | 7/2012 | Barth | H01L 33/54 |
| | | | | 257/89 |
| 2012/0193657 | A1 | 8/2012 | von Malm et al. | |
| 2012/0248469 | A1* | 10/2012 | Choi | H01L 33/508 |
| | | | | 257/88 |
| 2012/0274878 | A1* | 11/2012 | Kunz | H01L 33/50 |
| | | | | 349/69 |
| 2013/0265742 | A1* | 10/2013 | Shin | F21V 9/30 |
| | | | | 362/84 |
| 2014/0167092 | A1* | 6/2014 | Gartner | H01L 33/60 |
| | | | | 257/98 |
| 2014/0300267 | A1* | 10/2014 | Oh | F21K 9/64 |
| | | | | 313/46 |
| 2015/0049502 | A1 | 2/2015 | Brandl et al. | |
| 2015/0055319 | A1 | 2/2015 | Zink et al. | |
| 2015/0078010 | A1* | 3/2015 | Kundaliya | C25D 13/00 |
| | | | | 362/317 |
| 2016/0141469 | A1* | 5/2016 | Robin | H01L 33/507 |
| | | | | 257/88 |
| 2016/0329470 | A1* | 11/2016 | Butendeich | H01L 33/00 |
| 2017/0200765 | A1* | 7/2017 | Choi | H01L 33/504 |
| 2017/0256691 | A1 | 9/2017 | Brick et al. | |
| 2018/0371315 | A1 | 12/2018 | Hofmann et al. | |

FOREIGN PATENT DOCUMENTS

| | | | | |
|---|---|---|---|---|
| DE | 102014113275 A1 | 3/2016 | | |
| DE | 10 2015 101 573 A1 * | 8/2016 | ............ | H01L 33/50 |
| DE | 102015101573 A1 | 8/2016 | | |
| DE | 102016106841 B3 | 3/2017 | | |

OTHER PUBLICATIONS

German Search Report based on Application No. 10 2016 224 090.0 (8 pages) dated Oct. 17, 2017 (for reference purpose only).

* cited by examiner

OPTOELECTRONIC COMPONENT, A MODULE HAVING AT LEAST TWO OPTOELECTRONIC COMPONENTS, AND A METHOD FOR PRODUCING AN OPTOELECTRONIC COMPONENT

CROSS-REFERENCE TO RELATED APPLICATION

The present application is a national stage entry according to 35 U.S.C. § 371 of PCT application No.: PCT/EP2017/080799 filed on Nov. 29, 2017; which claims priority to German Patent Application Serial No.: 10 2016 224 090.0, which was filed on Dec. 5, 2016; all of which are incorporated herein by reference in their entirety and for all purposes.

TECHNICAL FIELD

The present disclosure relates to an optoelectronic component, to a module having at least two optoelectronic components, and to a method for producing an optoelectronic component.

BACKGROUND

It is known to equip still cameras with flashlight devices which comprise light-emitting diode components. Such flashlight devices are used particularly in still cameras or video cameras integrated into cell phones, and in other still cameras which have a housing with restricted spatial dimensions. It is therefore desirable to configure the flashlight devices themselves as compactly as possible, particularly with a small overall height.

Such an optoelectronic component is known, for example, from DE 10 2014 113 275.

SUMMARY

The present disclosure relates to improving the known prior art by providing an optoelectronic component, a module having at least two optoelectronic components, and a method for producing an optoelectronic component, in which the component or the module having at least two components has a compact design.

The optoelectronic component may include at least one semiconductor chip for emitting electromagnetic radiation, a conversion element for at least partial conversion of the primary radiation emitted by the semiconductor chip into electromagnetic secondary radiation where the conversion element is arranged downstream from the semiconductor chip in the emission direction and arranged on the semiconductor chip, and an optical element is arranged downstream from the conversion element in the emission direction where the conversion element is subdivided into individual portions.

The module may include at least two optoelectronic components where the semiconductor chips of the two or more optoelectronic components have different emission spectra.

The method for producing an optoelectronic component may include providing a semiconductor chip, applying a flat conversion layer on the semiconductor chips, and selectively removing the conversion layer in order to subdivide the conversion layer into individual portions.

An optoelectronic component may include at least one semiconductor chip for emitting electromagnetic radiation, a conversion element for at least partial conversion of the primary radiation emitted by the semiconductor chip into electromagnetic secondary radiation, the conversion element being arranged downstream of the semiconductor chip in the emission direction and being arranged on the semiconductor chip, and an optical element arranged downstream of the conversion element in the emission direction, the conversion element being subdivided into individual portions.

By the subdivision of the conversion element into individual portions and arrangement of the conversion element on the semiconductor chip, as well as by the subsequent optical element, good mixing of the light emitted by the semiconductor chip and the converted light, and therefore a high color homogeneity, is achieved. The subsequent optical element may be arranged directly on or near to the conversion element. By this arrangement, a high color homogeneity is achieved in the far-field, particularly in the target plane. By the combination of a subdivided conversion element and arrangement of the portions of the conversion element close to the chip, the distance between the chip and the optical element can become smaller and a compact, in particular flat, design of the optoelectronic component is achieved. In particular, in the case of the component, the base face is not substantially larger than the face of the semiconductor chip. The lateral extent of the optical element is in this case only insubstantially greater than the face of the semiconductor chip.

In the scope of the present application, the term "on" is intended to be understood as meaning that the conversion element arranged on the semiconductor chip is in direct contact with the semiconductor chip or in indirect contact, for example via a layer or film.

According to one embodiment, the semiconductor chip includes regions with different emission power of the electromagnetic radiation. In this way, a particular emission characteristic of the semiconductor chip can be used, so that in cooperation with further component parts of the optoelectronic component the emission direction, color homogeneity or other optical quantities can be deliberately influenced.

According to one embodiment, the semiconductor chip has an increased emission power of the electromagnetic radiation at the regions on which the portions of the conversion element are arranged.

According to one embodiment, the semiconductor chip may comprise selectively drivable regions. In this way, the emission behavior of the semiconductor chip can be deliberately controlled.

According to one embodiment, the semiconductor chip may be structured. By controlled structuring of the semiconductor chip, regions with a higher or lower emission intensity can be provided.

Both when using a semiconductor chip having selectively drivable regions and in the case of a structured semiconductor chip, a multiplicity of possibilities are provided for influencing the radiation emitted by the entire optoelectronic component. This is, for example, particularly advantageous when the portions of the conversion element comprise different converter types, which convert the radiation emitted by the semiconductor chip into radiation of different spectra. In this way, depending on the desired application or desired power spectrum, portions may deliberately be pumped to different extents by the radiation emitted by the semiconductor chip. Thus, different color loci can be adjusted deliberately, for example cold-white or warm-white.

According to one embodiment, the faces of the portions of the conversion element which face away from the semiconductor chip are rectangular, such as with an edge ratio of more than 1.2, such as more than 1.3. This offers a particular advantage in applications in which the target region to be illuminated is likewise rectangular. In general, the illumination of the target region is particularly effective when the upper side of the portions, i.e. the side of the portions which faces away from the semiconductor chip, corresponds to the symmetry of the region to be illuminated. The geometry of the surface of the portion may in this case also be imaged into the target plane by a lens. A rectangular surface of the portions is particularly advantageous, in particular with an edge ratio of more than 1.2 or more than 1.3, in the application as a flashlight in a camera.

According to one embodiment, the portions of the conversion element may be cuboid. Cuboid portions offer the advantage of particularly simple and therefore economical production. By symmetry between the shape of the individual light source, or the cavity, of the portions and of the target region, good illumination of the target region is achieved. Imaging errors of the optical element can be compensated for in this way.

According to one embodiment, the distance between the semiconductor chip and the optical element may be less than 500 µm, such as less than 200 µm. in this way, a compact, in particular flat, design of the optoelectronic component is achieved. This is of particular advantage in applications with little available space, for example in cell phones.

According to one embodiment, the optical element is an array of a multiplicity of optical microelements. In this way, the optical element can be made particularly thin, so that the optoelectronic component has a small overall height. The use of micro-optics, i.e. an array of a multiplicity of optical microelements, is only made possible at all by the spatial subdivision of the conversion element into portions. The portions therefore cooperate advantageously with the micro-optics.

According to one non-limiting embodiment, each portion of the conversion element is assigned an optical microelement. In this way, a portion of the conversion element and an optical microelement may respectively be oriented in such a way that the portion of the conversion element lies at the focal point or close to the focal point of the optical microelement. In this way, the radiation generated by the conversion element can be directed particularly effectively and free from loss into the target region.

According to one embodiment, the optical element may form an array of microlenses.

In an alternative embodiment, the optical element may form an array of microreflectors.

According to one embodiment, the optical element is arranged at a distance from the conversion element. By the additional interface for refraction of the radiation emitted by the semiconductor chip, the losses in the optical element can be reduced. In this way, the efficiency of the component is increased and the light can be imaged better into the target region.

According to one embodiment, the optoelectronic component includes a planar upper side, which is formed by the optical element or by encapsulation. In this way, in particular, the further processing is simplified since the planar surface can be damaged less easily. For example, application of protective glass is not necessary.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the illumination apparatus.

In the following description, various aspects are described with reference to the following drawings, in which.

DETAILED DESCRIPTION

In the figures, the first digit(s) of a reference indicate the figure on which the reference is first used. The same references are used for elements or properties which are of the same type or have the same effect in all the figures. The figures and the size proportions of the elements represented in the figures with respect to one another are not to be regarded as true to scale. Rather, individual elements may be represented exaggeratedly large for better representability and/or for better comprehensibility.

Figure 1:
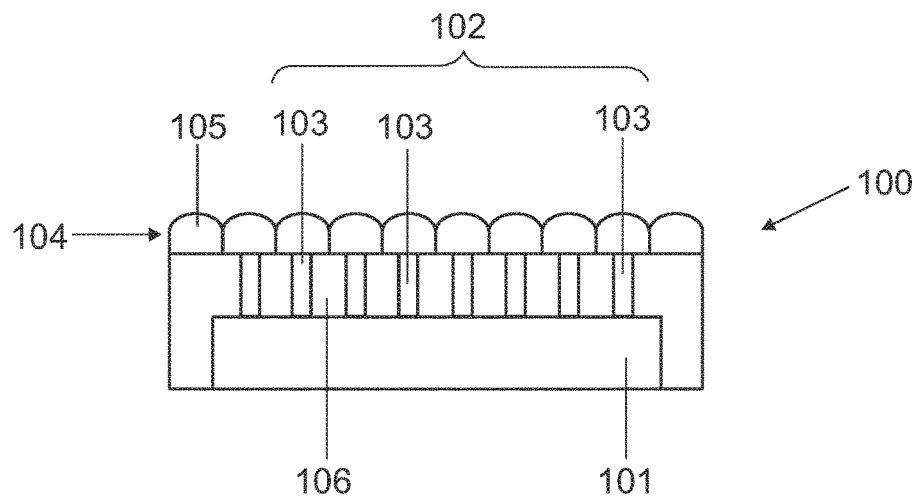
FIG. 1 shows a schematic representation of a cross section of an optoelectronic component according to a first embodiment.

FIG. 1 shows a schematic representation of a cross section of an optoelectronic component 100 according to a first embodiment.

The optoelectronic component 100 includes a semiconductor chip 101. The semiconductor chip 101 is a semiconductor chip based on a III-V semiconductor material. The semiconductor chip 101 is an LED chip. The semiconductor chip 101 emits visible electromagnetic radiation, or light, or alternatively the semiconductor chip 101 may also emit invisible radiation, for example UV radiation. The semiconductor chip 101 may also comprise further layers, for example apertures or covers for spatial modulation of the radiation emitted by the semiconductor chip 101.

The semiconductor chip 101 may be applied on a carrier (not shown). A conversion element 102 is arranged downstream of the semiconductor chip 101 in the emission direction and is applied on the semiconductor chip 101. The conversion element 102 is particularly in direct contact with the semiconductor chip 101, or at least in indirect contact, i.e. a layer or film may be provided between the semiconductor chip 101 and the conversion element 102. The layer or film is in this case radiation-transmissive. For example, a silicone layer having a thickness of from 0.5 to 50 µm may be provided.

The conversion element 102 is configured for at least partial conversion of the primary radiation emitted by the semiconductor chip 101 into electromagnetic secondary radiation. In other words, the conversion element 102 is configured in order to convert the radiation emitted by the semiconductor chip 101 partially or fully into further radiation having a different, in particular longer, wavelength than the emitted radiation.

The conversion element 102 is in this case subdivided into individual portions. The conversion element 102 is, in particular, subdivided into at least two portions 103. The portions 103 are in this case discrete from one another, i.e. they are not in contact with one another and do not touch.

In the first embodiment, all the portions 103 have the same geometrical shape, and in particular are cuboid or approximately cuboid in the scope of manufacturing tolerances. The portions 103 also have the same size, i.e. the same volume and the same edge lengths. According to the first embodiment, the portions 103 are arranged equidistantly, i.e. with equal distances from one another.

The portions 103 may, however, also have different geometrical shapes and/or different sizes. For example, the portions 103 may have the shape of cylinders, columns, conic frustums, pyramids or any other desired shape. In particular, particularly good illumination of the target region can be achieved by the shape of the upper side of the portions 103, i.e. the side of the portions facing away from the semiconductor chip 101, when the shape of the upper side corresponds to the symmetry of the region to be illuminated. The light distribution in the target region can therefore be influenced 103 by the portions. The distances of the portions 103 from one another may also vary inside the component 100. Overall, the structure of the optoelectronic component allows greater freedom in the choice of the shape and arrangement of the portions 103.

The portions 103 may furthermore include the same converter material, or different converter materials so that the radiation emitted by the semiconductor chip 101 is converted into radiation with different wavelengths.

The gaps between the portions 103 are filled with encapsulation 106. The encapsulation 106 is transparent, or radiation-transmissive, for example made of silicone or epoxide, and may optionally contain reflective particles, for example particles of $TiO_2$. The encapsulation 106 may, however, also be omitted so that the gaps are filled with air or another gas. As an alternative, a nontransparent material may be provided between the portions 103 and the side faces of the portions 103 may be mirrored.

The optoelectronic component 100 furthermore includes an optical element 104, which is arranged downstream of the conversion element 102 in the emission direction. The radiation generated by the semiconductor chip 101 and the conversion element 102 is directed into the target region by the optical element 104. The optical element 104 may for example consist of PMMA (polymethyl methacrylate), PC (polycarbonate) epoxide, glass or silicone.

According to the first embodiment, the optical element 104 is an array consisting of a multiplicity of optical microelements. According to the first embodiment, the optical element 104 consists of a plurality of microlenses 105, which are arranged in an array. They microlenses 105 are, in particular, convex. The optical element offers the advantage that it can be produced simply and economically, for example at the wafer level.

The semiconductor chip 101 may furthermore include regions with increased emission power of the electromagnetic radiation. Advantageously, the portions 103 are arranged in the regions of the semiconductor chip 101 which have an increased emission power. In other words, the semiconductor chip 101 should emit where the portions 103 of the conversion element 102 are located. For example, the semiconductor chip 101 may include selectively drivable regions, i.e. individual pixels of the semiconductor chip 101 can be driven separately. A further possibility is to provide a structured semiconductor chip 101, in which the light is generated predominantly under or only under the portions 103 of the conversion element 102.

Figure 2:
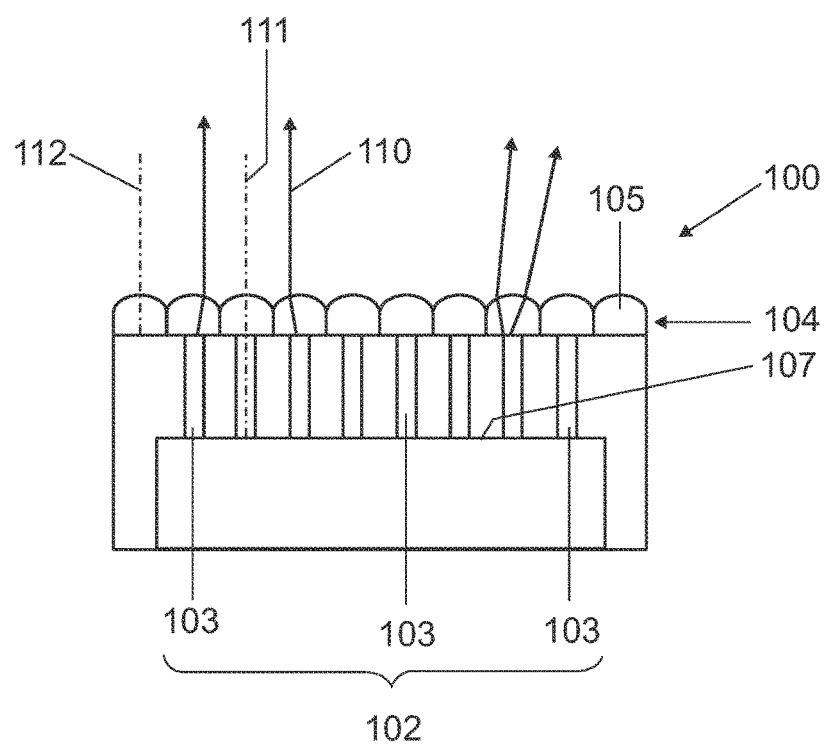
FIG. 2 shows a schematic representation of the beam path of the electromagnetic radiation inside an optoelectronic component according to the first embodiment.

FIG. 2 shows a schematic representation of the beam path of the electromagnetic radiation inside an optoelectronic component 100 according to the first embodiment. Depending on the configuration, the optical element 104 directs the emitted radiation 110 into different regions of the target region. In the present embodiment, the emitted radiation 110 is distributed uniformly over the target region by the use of a microlens array, i.e. into the corners, onto the edge and into the center.

The optical element 104 has a thickness of less than 500 µm, such as less than 200 µm, such as a thickness of 100 µm. The small overall height of the optical element 104 is achieved in particular by the use of optical microelements. In this way, a small overall height of the optoelectronic component 100 is achieved overall.

Advantageously, the portions 103 and the microlenses 105 are arranged in such a way that each portion 103 is assigned a microlens 105. In this way, a particularly uniform emission characteristic is achieved. The portions 103 may lie in particular, respectively at the focal point or approximately at the focal point of the assigned microlenses 105.

As an alternative, the microlenses 105, or selectively chosen individual microlenses 105, may also be arranged offset with respect to the portions 103 of the conversion element 102, in order to achieve a lateral offset of the emission and therefore controlled or enhanced illumination of particular regions. This allows great flexibility in the external appearance of the optoelectronic component 100.

In the first embodiment, furthermore, the principal axis 111 of a portion 102 and the principal axis 112 of a microlens are parallel to one another or even lie on the same axis. The two principal axes 111, 112 are in this case oriented perpendicularly to the emission face 107 of the semiconductor chip 101. As an alternative, the axes may also be tilted by up to 30 degrees relative to the emission face 107 of the semiconductor chip 101. In this way, emitted radiation may be directed to a particular target plane or a particular target region.

Figure 3:
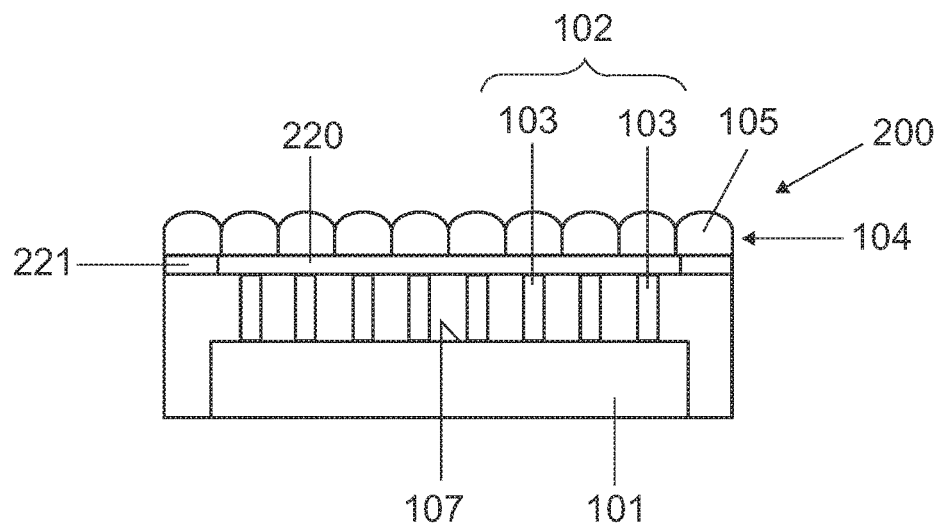
FIG. 3 shows a schematic representation of a cross section of an optoelectronic component according to a second embodiment.

FIG. 3 shows a schematic representation of a cross section of an optoelectronic component 200 according to a second embodiment.

The second exemplary embodiment corresponds to the first embodiment, with the difference that the optical element 104 is arranged at a distance from the conversion element 102. In this case, a space 220, which may for example be filled with air, is provided between the optical element 104 and the conversion element 102. The optical element 104 is in this case fixed by means of a spacer 221 on the housing or the encapsulation of the component 200. The spacer 221 may, for example, be integrated into the optical element 104 and/or formed in one piece with the optical element 104. This may, for example, be carried out through production by means of an injection molding method. As an alternative, an adhesive which is filled with particles of a particular size, for example with a size of at least 50 µm, may be used as a spacer 221. The distance between the conversion element 102 the optical element 104 is defined by means of the particle size.

In all the embodiments, the distance between the emission face 107 of the semiconductor chip 101 and the optical element 104 is less than 500 µm, such as less than 200 µm.

Figure 4:
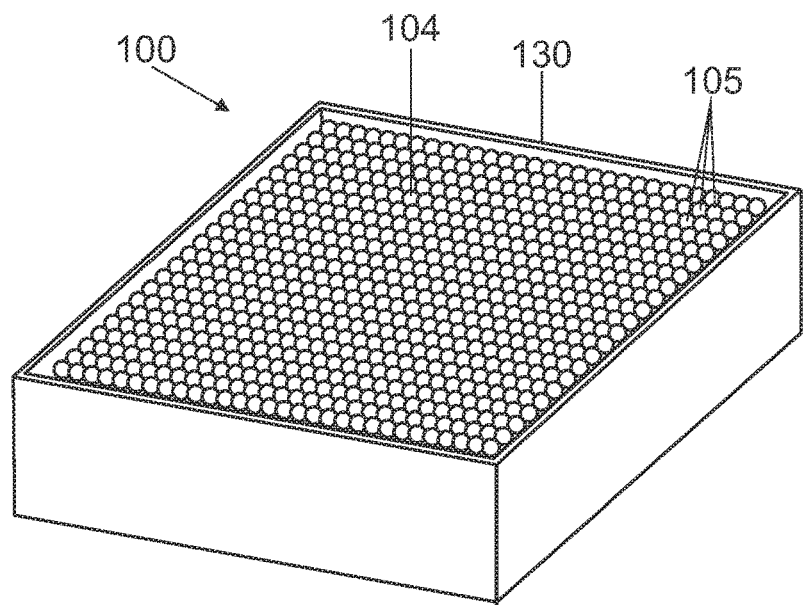
FIG. 4 shows a schematic representation of a perspective view of the optoelectronic component according to the first embodiment.

FIG. 4 shows a schematic representation of a perspective view of the optoelectronic component 100 according to the first exemplary embodiment. The optoelectronic component 100 in this case also includes a housing 130, in which the semiconductor chip 101 is arranged and which as a cover section includes the optical element 104 consisting of the optical microelements 105. In this first embodiment, convex microlenses 105 are provided as optical microelements 105. However, any other lens shape may also be envisioned, for example spherical, aspherical, conical, toroidal, biconical, freeform or any other lens shape. The microlenses 105 image the end of the portions 102 into the far-field.

Furthermore, FIG. 4 shows a square arrangement of the microlenses 105, although any other arrangement may also be envisioned, for example rectangular, hexagonal or a Fibonacci arrangement. The microlenses 105 may also be arranged statistically distributed.

In general, the optoelectronic component 100 allows great freedom in the type and arrangement of the portions 102 as well as of the optical microelements. The particular configuration may be carried out in such a way that a certain external appearance is achieved. In the arrangement of the individual elements, there is furthermore a relatively large tolerance in relation to the arrangement and spacing along the emission direction of the semiconductor chip 101. The positioning of the optical element 104 relative to the semiconductor chip 101 along the emission direction may be varied, so long as the arrangement of the optical element 104 relative to the conversion element 102 is exact along the other two principal spatial directions. In other terms, in a coordinate system whose z axis corresponds to the emission direction of the semiconductor chip 101, there is freedom in terms of the orientation of the optical element 104 relative to the conversion element 102, but small tolerances apply to the orientation along the x axis and the y axis. By a defined arrangement of the optical microelements, for example, a predetermined industrial design or logo may be externally visible on the optoelectronic component 100.

According to the first embodiment, the optoelectronic component 100 includes one semiconductor chip 101. As an alternative, more than one semiconductor chip 101 may also be arranged in the housing 104. The semiconductor chips 101 may in this case have different emission characteristics, for example different emission spectra or different color temperatures. The mixing of the radiation takes place in the target plane, i.e. in the far-field.

Figure 5:
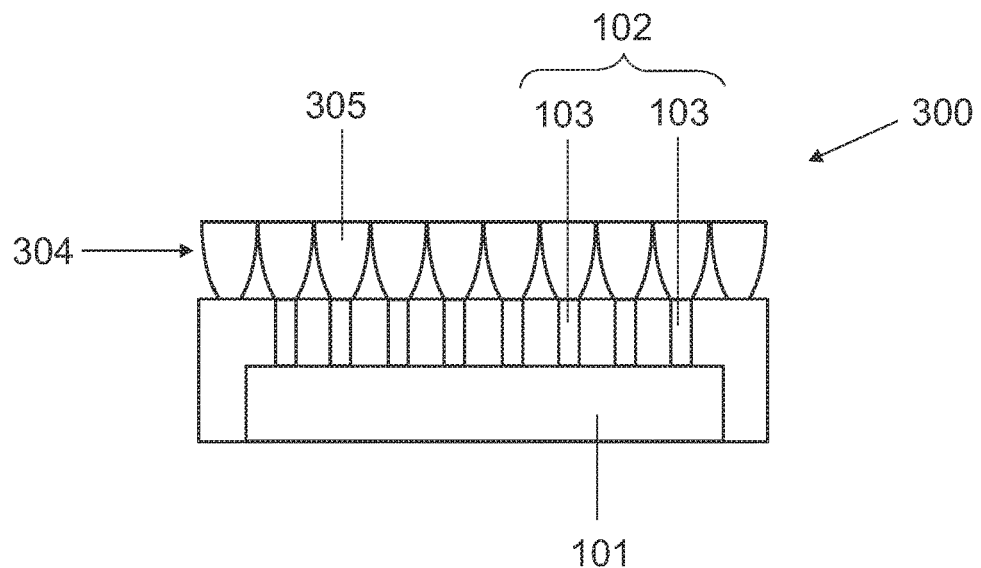
FIG. 5 shows a schematic representation of a cross section of an optoelectronic component according to a third embodiment.

FIG. 5 shows a schematic representation of a cross section of an optoelectronic component 300 according to a third embodiment.

The optoelectronic component 300 according to the third embodiment includes an optical element 304, which includes microreflectors 305 or other reflective elements as optical microelements. The microreflectors 305 may in this case have any shape, for example elliptical, parabolic or spherical. Furthermore, the microreflectors may be configured as concave mirrors with a reflective coating, or also as a TIR (total internal reflection) reflector, for example a CPC (compound parabolic concentrator).

According to the third embodiment, the microreflectors 305 are configured as conic frustums. The reflective materials are selected in such a way that a material with a high refractive index is provided inside the reflector and a material with a low refractive index is provided outside the reflector. For example, the conic frustums may consist of solid material such as polymer, silicone or epoxy. As an alternative, the reflectors may have a particular wall thickness with a coating on the interface.

Figure 6:
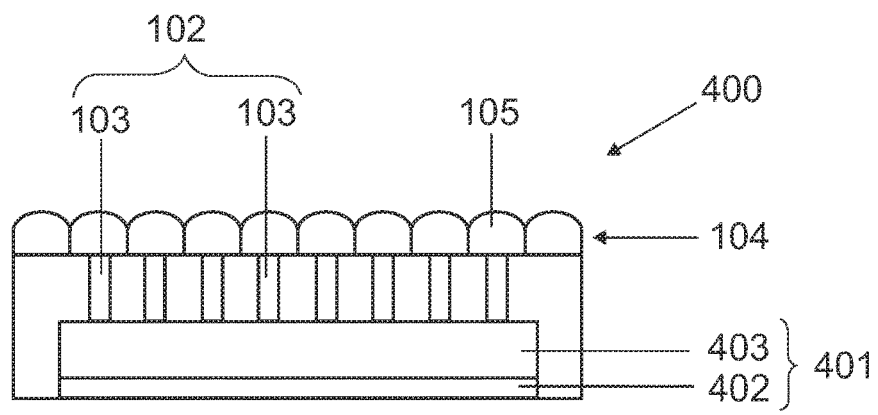
FIG. 6 shows a schematic representation of a cross section of an optoelectronic component according to a fourth embodiment.
Figure 7:
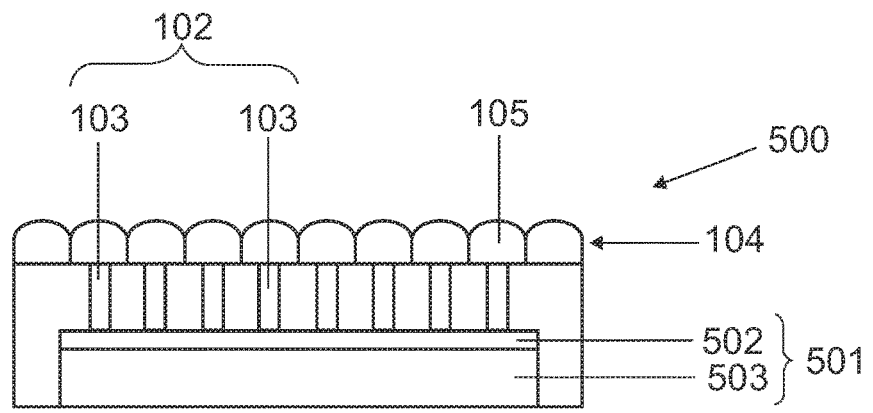
FIG. 7 shows a schematic representation of a cross section of an optoelectronic component according to a fifth embodiment.
Figure 8:
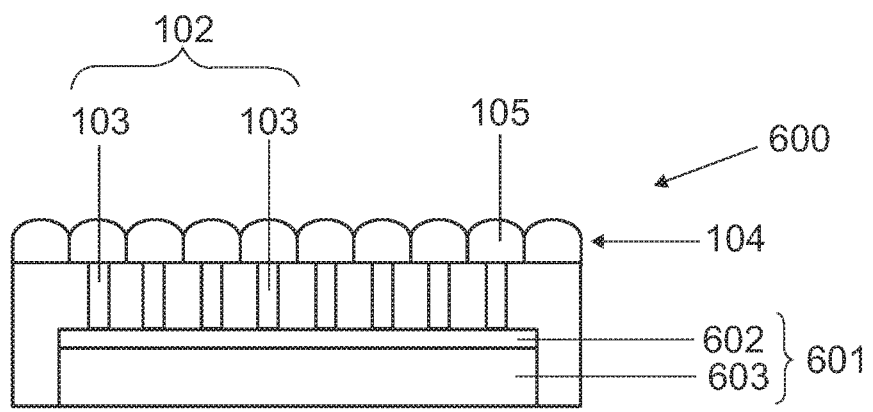
FIG. 8 shows a schematic representation of a cross section of an optoelectronic component according to a sixth embodiment.

FIGS. 6 to 8 show schematic representations of a cross section of an optoelectronic component according to a fourth, fifth and sixth embodiment.

The embodiments of FIGS. 6 to 8 in this case correspond to the first embodiment, with the exception of the semiconductor chip used.

FIG. 6 shows an optoelectronic component 400 in which the optoelectronic semiconductor chip 401 consists of a radiation-emitting layer 402, or epitaxial layer, which is applied on a substrate 403 or carrier. The substrate 403 is in this case arranged between the radiation-emitting layer 402 and the conversion element 102. The substrate is transparent, or radiation-transmissive, for example made of sapphire, SiC, AlGaN, and is used for mixing the radiation emitted by the radiation-emitting layer 402.

FIGS. 7 and 8 show an optoelectronic component 500, 600, in which the semiconductor chip 501, 601 consists of a radiation-emitting layer 502, 602 and a substrate 503, 603, on which the radiation-emitting layer 502, 602 is applied. The radiation-emitting layer 502, 602 is in this case arranged between the substrate 503, 603 and the conversion element 102. The substrate 503 according to the fifth embodiment is in this case made of a radiation-nontransmissive material, for example of Si, Ge, GaAs, GaP or GaN, while the substrate 603 according to the sixth embodiment consists of a radiation-transmissive, or transparent, material, for example of SiC, sapphire, AlGaN.

Figure 9:
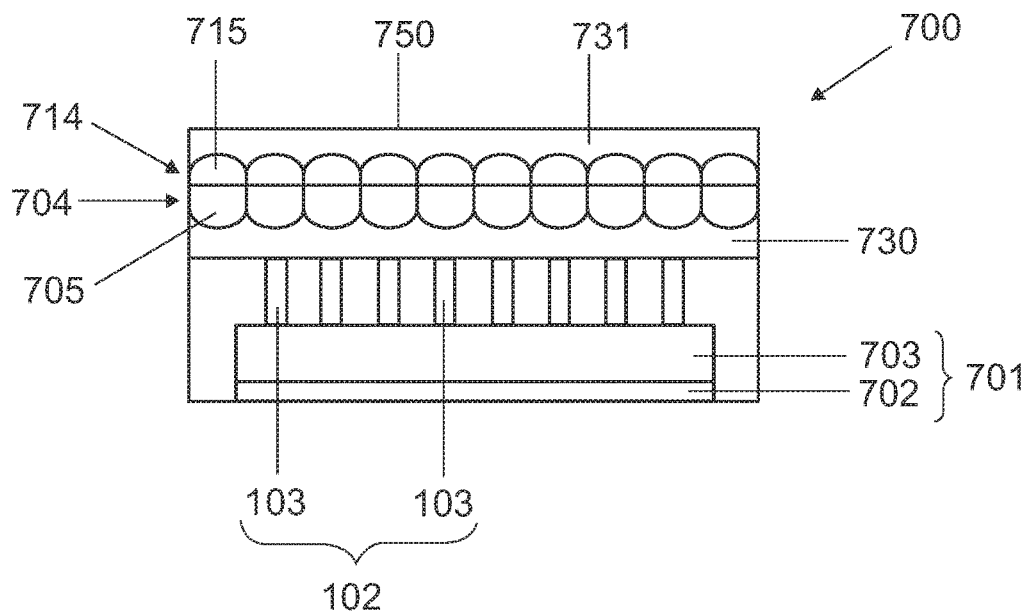
FIG. 9 shows a schematic representation of a cross section of an optoelectronic component according to a seventh embodiment.
Figure 10:
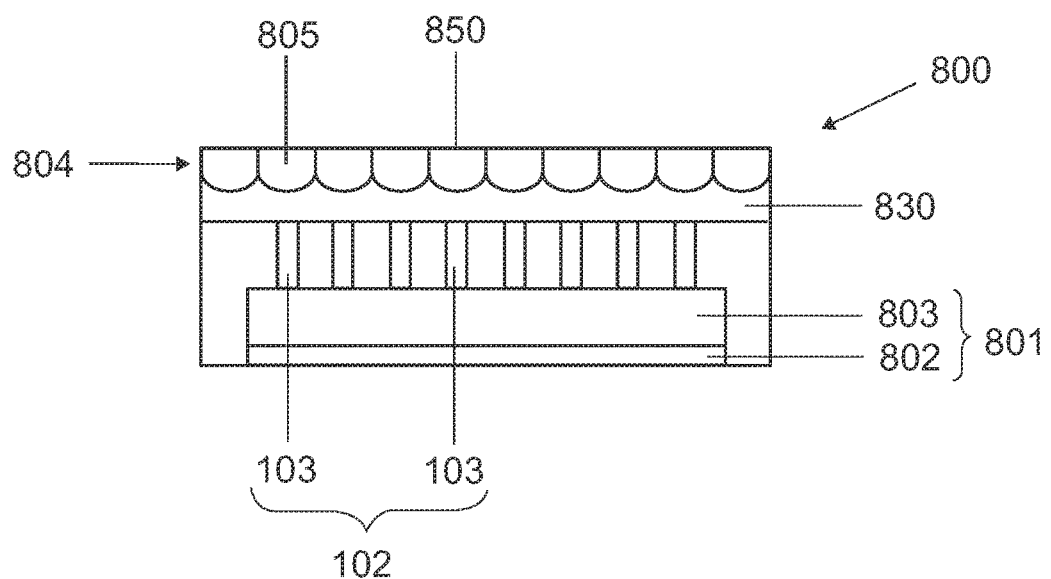
FIG. 10 shows a schematic representation of a cross section of an optoelectronic component according to an eighth embodiment.
Figure 11:
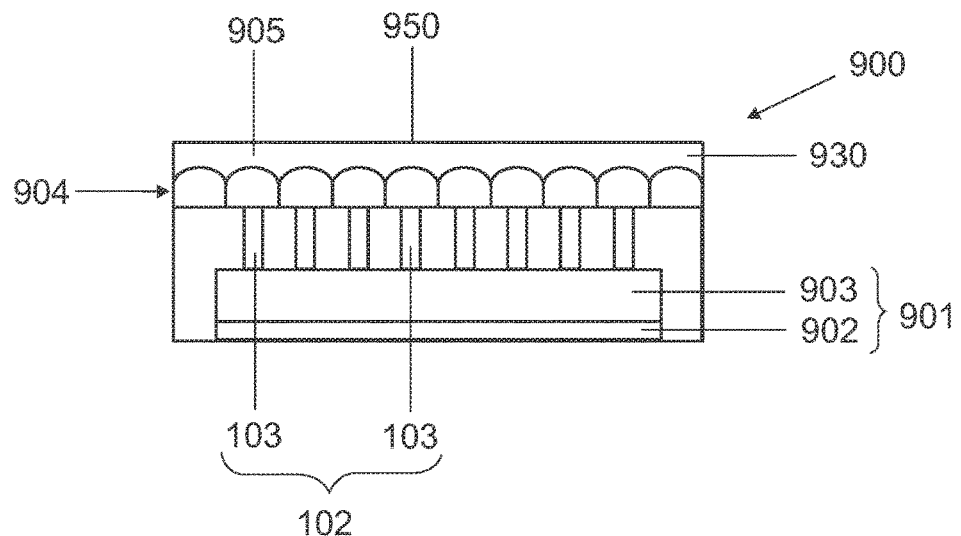
FIG. 11 shows a schematic representation of a cross section of an optoelectronic component according to a ninth embodiment.

FIGS. 9 to 11 show schematic representations of a cross section of an optoelectronic component according to a seventh, eighth and ninth embodiment. Common to all these embodiments is the feature according to which the upper side, i.e. the radiation-emitting side of the component, is planar, i.e. the component has a planar surface on the radiation-emitting side.

FIG. 9 shows an optoelectronic component 700 according to a seventh embodiment, in which the semiconductor chip 701 is constructed as in the fourth embodiment. That is to say, the semiconductor chip 701 consists of a radiation-emitting layer 702, or epi layer, which is applied on a substrate 703 or carrier. The substrate 703 is in this case arranged between the radiation-emitting layer 702 and the conversion element 102. The substrate is transparent or radiation-transmissive. Any other configuration, described in this application, of the semiconductor chip 701 may, however, also be envisioned.

In this seventh embodiment, the component 700 includes a first optical element 704 and a second optical element 714. The optical elements 704, 714 in this case include optical microlenses 705, 715, although any other configuration of the optical elements 704, 714 is also possible. In particular, the two optical elements 704, 714 may include different types of optical microelements. The two optical elements 704, 714 may also be formed in one piece, in particular without an interface.

In the structure according to the seventh embodiment, the two optical elements 704, 714 are joined to one another by the planar side. Between the microlenses of the first optical 704 and the conversion element 102, there is a first encapsulation 730, which consists of transparent, or radiation-transmissive, material, for example silicone or epoxide. On the upper side 750 of the optoelectronic component 700, i.e. on the outermost face of the optoelectronic component 700 in the emission direction, there is a second encapsulation 731, which is configured in the same way as the first encapsulation 730 or may be different thereto. The second encapsulation 731 is likewise transparent, or radiation-transmissive. Because of the second encapsulation 731, the optoelectronic component 700 has a planar surface on the upper side 750. As an alternative, the second encapsulation 731 may also be omitted, so that the radiation exit face of the optoelectronic component 700 is formed directly by the second optical component 714.

FIG. 10 shows an eighth embodiment of the optoelectronic component 800, in which the semiconductor 801 is constructed as in the fourth embodiment. That is to say, the semiconductor chip 801 consists of a radiation emitting layer 802, or epitaxial layer, which is applied on a substrate 803 or carrier. The substrate 803 is in this case arranged between the radiation-emitting layer 802 and the conversion element 102. The substrate is transparent or radiation-transmissive. However, any other configuration, described in this application, of the semiconductor chip 801 may also be envisioned.

The optical element 804 is in this case constructed from microlenses 805, and is arranged inside the optoelectronic component 800 in such a way that the planar face of the optical element 804 forms the upper side 850 of the optical component 800. Provided between the conversion element 102 and the optical element 804, there is a radiation-transmissive encapsulation 830, which may be configured according to the first encapsulation 730 of the seventh embodiment.

FIG. 11 shows a ninth embodiment of the optoelectronic component 900, in which the semiconductor 901 is constructed as in the fourth embodiment. That is to say, the semiconductor chip 901 consists of a radiation-emitting layer 902, or epitaxial layer, which is applied on a substrate 903 or carrier. The substrate 903 is in this case arranged between the radiation-emitting layer 902 and the conversion element 102. The substrate is transparent or radiation-transmissive. However, any other configuration, described in this application, of the semiconductor chip 901 may also be envisioned.

In this embodiment, as in the first to sixth embodiments, the optical element 904 is arranged on the conversion element 102. The optical element 904 consists of microlenses 905, although any other configuration described may be envisioned. On the optical element 905, i.e. downstream of the optical element 905 in the emission direction, there is an encapsulation 930 of radiation-transmissive material which may be configured as the first encapsulation 730 of the seventh embodiment. The encapsulation 930 forms a planar surface on the upper side 950 of the optoelectronic component 900.

In the seventh to ninth embodiments, the materials for the respective encapsulation 730, 731, 830, 930 and for the optical element 704, 714, 804, 904 are selected in such a way that maximally low-loss output of the radiation from the optoelectronic component can take place, i.e. with the lowest possible losses, for example by total reflection. The material for the encapsulation 730, 731, 830, 930 is therefore a material having a low refractive index, such as having a refractive index of less than 1.55. The material for the optical element 704, 714, 804, 904 is a material having a high refractive index, such as having a refractive index of more than 1.55.

Figure 12:
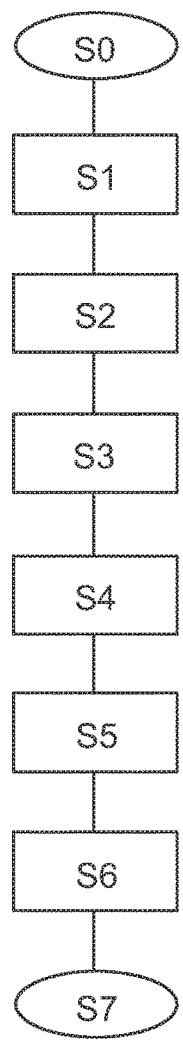
FIG. 12 shows a schematic sequence of a method for producing the optoelectronic component.

FIG. 12 shows a schematic sequence of a method for producing the optoelectronic component. The description of the method is carried out by way of example with the aid of the first embodiment, although it may naturally be applied with corresponding adaptation to any other embodiment described here.

In S1, a semiconductor chip 101 is provided. In S2, which is optional and may therefore also be omitted, in order to protect the semiconductor chip 101, or in order to protect the metallization layer or epi layer of the semiconductor chip 101, a thin film, for example of silicone, is applied onto the semiconductor chip 101. In S3, a flat conversion layer is applied onto the semiconductor chip 101. In S4, the conversion layer is structured in order to form the portions 103 of the conversion element 102. This may be carried out by sawing or laser processing. The conversion layer may also be structured lithographically or by direct inscribing. An alternative to S3 and S4 is to produce the conversion element 102 beforehand in a separate mold casting process and then to apply it onto the semiconductor chip 101. In S5, which is likewise optional, encapsulation 106 may also be introduced between the portions 102. In S6, the optical element 104 is furthermore applied. The process ends with S7.

The optoelectronic component and the method for producing an optoelectronic component have been described with the aid of some embodiments in order to illustrate the underlying concept. The embodiments are not in this case restricted to particular feature combinations. Even though some features and configurations have been described only in connection with a particular embodiment or individual exemplary embodiments, they may respectively be combined with other features from other embodiments. It is likewise possible to omit or add features presented individually or particular configurations in embodiments, so long as the general technical teaching is still implemented.

In particular, all described semiconductor chips may be combined with all described types of optical elements, with and without encapsulation, and the optoelectronic components relates are not restricted to the presented combinations of semiconductor chips and optical elements.

Even though the method for producing an optoelectronic component are described in a particular order, it is clear that each of the methods described in this disclosure may be carried out in any other expedient order, and method aspects or limitations may be omitted or added so long as the underlying concept of the technical teaching described is not departed from.

LIST OF REFERENCES 100 optoelectronic component
101 semiconductor chip
102 conversion element
103 portions
104 optical element
105 microlenses
106 encapsulation
107 emission face of the semiconductor chip 101
110 emitted radiation
111 principal axis of a portion 103
112 principal axis of a microlens 105
130 housing 200 optoelectronic component
220 space
221 spacer
300 optoelectronic component
304 optical element
305 microlenses
400 optoelectronic component
401 semiconductor chip
402 radiation-emitting layer
403 substrate
500 optoelectronic component
501 semiconductor chip
502 radiation-emitting layer
503 substrate
600 optoelectronic component
601 semiconductor chip
602 radiation-emitting layer
603 substrate
700 optoelectronic component
701 semiconductor chip
702 radiation-emitting layer
703 substrate
704 first optical element
705 microlenses
714 second optical element
715 microlenses
730 first encapsulation
731 second encapsulation
750 upper side
800 optoelectronic component
801 semiconductor chip
802 radiation-emitting layer
803 substrate
804 optical element
805 microlenses
830 encapsulation
850 upper side
900 optoelectronic component
901 semiconductor chip
902 radiation-emitting layer
903 substrate
904 optical element
905 microlenses
930 encapsulation
950 upper side

The invention claimed is:

1. An optoelectronic component comprising:
at least one semiconductor chip for emitting electromagnetic radiation,
a conversion element for at least partial conversion of a primary radiation emitted by the at least one semiconductor chip into a secondary radiation, wherein the conversion element is arranged downstream of the at least one semiconductor chip in an emission direction and is arranged on the at least one semiconductor chip, and
an optical element arranged downstream of the conversion element in the emission direction,
wherein the conversion element is subdivided into a plurality of portions; and wherein at least one individual portion of the plurality of portions does not contact any other individual portion of the conversion element; and wherein the plurality of portions of the conversion element are arranged directly over a single semiconductor chip of the at least one semiconductor chip.

2. The optoelectronic component as claimed in claim 1, wherein the at least one semiconductor chip comprises regions with different emission power of the electromagnetic radiation.

3. The optoelectronic component as claimed in claim 1, wherein the at least one semiconductor chip has an increased emission power of the electromagnetic radiation at regions on which the plurality of portions of the conversion element are arranged.

4. The optoelectronic component as claimed in claim 1, wherein the at least one semiconductor chip comprises selectively drivable regions.

5. The optoelectronic component as claimed in claim 1, wherein the at least one semiconductor chip is structured.

6. The optoelectronic component as claimed in claim 1, wherein one or more faces of the plurality of portions of the conversion element which face away from the at least one semiconductor chip are rectangular.

7. The optoelectronic component as claimed in claim 1, wherein the portions of the conversion element are cuboid.

8. The optoelectronic component as claimed in claim 1, wherein a distance between the at least one semiconductor chip and the optical element is less than 500 μm.

9. The optoelectronic component as claimed in claim 1, wherein the optical element is an array of a multiplicity of optical microelements.

10. The optoelectronic component as claimed in claim 9, wherein each portion of the conversion element is assigned an optical microelement.

11. The optoelectronic component as claimed in claim 9, wherein the optical element comprises an array of microlenses.

12. The optoelectronic component as claimed in claim 9, wherein the optical element comprises an array of microreflectors.

13. The optoelectronic component as claimed in claim 1, wherein the optical element is arranged at a distance from the conversion element.

14. The optoelectronic component as claimed in claim 1, wherein the optoelectronic component comprises a planar upper side formed by the optical element or by encapsulation.

15. The optoelectronic component of claim 1, further comprising a gap between two individual portions of the plurality of portions arranged over the single semiconductor chip, wherein the gap comprises an encapsulation material.

16. The optoelectronic component of claim 1, further comprising a gap between two individual portions of the plurality of portions arranged over the single semiconductor chip, wherein the gap comprises air.

17. The optoelectronic component of claim 1, further comprising a transparent encapsulation layer between at least the individual portion of the plurality of portions arranged over the single semiconductor chip and the optical element.

18. The optoelectronic component of claim 15, wherein the optical element comprises a plurality of optical microelements where an optical microelement is arranged over an individual portion; wherein the optical microelement is arranged on substantially the same axis as the individual portion.

19. A module comprising at least two optoelectronic components; wherein each of the at least two optoelectronic components comprises:
at least one semiconductor chip for emitting electromagnetic radiation, a conversion element for at least partial conversion of a primary radiation emitted by the at least one semiconductor chip into an electromagnetic secondary radiation, wherein the conversion element is arranged downstream of the at least one semiconductor chip in the emission direction and is arranged on the at least one semiconductor chip, and an optical element arranged downstream of the conversion element in an emission direction, wherein the conversion element is subdivided into a plurality of portions; and wherein at least one individual portion of the plurality of portions does not contact any other individual portion of the conversion element; and wherein the plurality of portions are arranged directly over a single semiconductor chip of the at least one semiconductor chip;

wherein two or more of the semiconductor chips of the at least two optoelectronic components have different emission spectra.

20. A method for producing an optoelectronic component comprising:

providing a single semiconductor chip, applying a flat conversion layer on the single semiconductor chip, and selectively removing the flat conversion layer in order to subdivide the flat conversion layer into a plurality of portions to where at least one individual portion of the plurality of portions does not contact any other individual portion of the conversion element; and wherein the plurality of portions of the flat conversion element are arranged directly over the single semiconductor chip; and providing an optical element arranged downstream of the flat conversion element in an emission direction of the single semiconductor chip.

* * * * *